United States Patent
Lee

(10) Patent No.: US 7,544,564 B2
(45) Date of Patent: Jun. 9, 2009

(54) METHOD OF FORMING GATE ELECTRODE PATTERN IN SEMICONDUCTOR DEVICE

(75) Inventor: Sung Hoon Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 227 days.

(21) Appl. No.: 11/297,885

(22) Filed: Dec. 9, 2005

(65) Prior Publication Data
US 2006/0205160 A1   Sep. 14, 2006

(30) Foreign Application Priority Data
Mar. 9, 2005   (KR) ............... 10-2005-0019643

(51) Int. Cl.
*H01L 21/336* (2006.01)
(52) U.S. Cl. ............... 438/257; 438/197; 257/E21.209; 257/E21.21
(58) Field of Classification Search ............... 438/201, 438/212, 255–266, 197, 211, 430, 592, 593; 257/239, 314
See application file for complete search history.

(56) References Cited

U.S. PATENT DOCUMENTS

| 6,060,740 | A * | 5/2000 | Shimizu et al. ............ 257/314 |
| 6,391,722 | B1 * | 5/2002 | Koh ............ 438/264 |
| 6,410,428 | B1 | 6/2002 | Chiang et al. |
| 6,429,108 | B1 | 8/2002 | Chang et al. |
| 2002/0081796 | A1 | 6/2002 | Han et al. |
| 2004/0121569 | A1 | 6/2004 | Storbeck et al. |
| 2005/0009272 | A1 * | 1/2005 | Chen et al. ............ 438/257 |

FOREIGN PATENT DOCUMENTS

| JP | 61-163660 | 7/1986 |
| KR | 10-2001-0061397 A | 7/2001 |
| KR | 10-2003-0002717 A | 1/2003 |
| KR | 10-2005-0011728 A | 1/2005 |
| KR | 10-2006-0023489 A | 3/2006 |
| TW | 383474 B | 3/2000 |

* cited by examiner

*Primary Examiner*—W. David Coleman
*Assistant Examiner*—Sonya D McCall-Shepard
(74) *Attorney, Agent, or Firm*—Townsend and Townsend and Crew LLP

(57) ABSTRACT

A method for forming a semiconductor device includes forming a gate dielectric layer over a substrate; forming a first conductive layer over the substrate; forming a dielectric layer over the first conductive layer; forming a second conductive layer over the dielectric layer; forming a sacrificial layer over the second conductive layer; patterning the sacrificial and other layers to form a plurality of gate electrode patterns; forming a buried oxide layer over and between the gate electrode patterns; and removing the sacrificial layer to form a plurality of trenches surrounded by the buried oxide layer. A metal layer is formed within the trench to form a plurality of metal gate structures, the metal layer contacting the second conductive layer that is exposed by the removal of the sacrificial layer.

9 Claims, 3 Drawing Sheets

METHOD OF FORMING GATE ELECTRODE PATTERN IN SEMICONDUCTOR DEVICE

BACKGROUND OF THE INVENTION

The present invention relates to a method of fabricating semiconductor devices, and more specifically, to a method of forming gate electrode patterns of a semiconductor device.

As the level of integration of semiconductor devices increases, a gate electrode technique of a polycide/polysilicon/silicide structure using a refractory metal element such as tungsten has emerged. The gate electrode of the polycide structure is the limiting factor to the improvements of the operating speed of an ultra-high integrated semiconductor device. In view of the above, there has recently been active research in techniques using a refractory metal such as tungsten as the gate electrode.

In a subsequent oxidization ambient process, however, a refractory metal such as tungsten is exposed, and abnormal oxidization such as tungsten oxide ($WO_3$) is generated at the sidewalls of refractory metals, resulting in a damaged profile of the gate electrode. It becomes an obstacle to obtaining desired device characteristics since the damaged profile of the gate electrode influences subsequent processes.

Furthermore, if refractory metals such as tungsten are severely oxidized, the amount of refractory metal is reduced. This presents the problem that resistance of the gate electrode is increased.

Accordingly, there is a need for techniques for solving problems which may be generated when refractory metal such as tungsten are used in a gate electrode.

BRIEF SUMMARY OF THE INVENTION

One embodiment of the present invention relates to a method of forming gate electrode patterns of semiconductor devices using refractory metal as part of a gate electrode.

According to an embodiment of the present invention provides a method of forming gate electrode patterns of semiconductor devices, including the steps of forming a plurality of first gate electrode patterns in which a first conductive film, a dielectric film, a second conductive film, and a sacrificial film are laminated on a semiconductor substrate; forming a buried insulation film between the first gate electrode patterns; removing the sacrificial film to form a trench surrounded by the buried insulation film and the second conductive film; and forming a metal film within the trench to form a plurality of second gate electrode patterns in which the metal film is laminated on the second conductive film.

The sacrificial film is used to define a region where the metal film will be formed as part of the first gate electrode patterns. The sacrificial film may be a nitride film. The step of removing the sacrificial film may be performed using a solution containing phosphoric acid ($H_3PO_4$).

The buried insulation film having a good selectivity against the sacrificial film is formed. The buried insulation film is formed using an oxide film. The formation of the buried insulation film is performed before the metal film formation process in order to prevent the metal film from being oxidized. The metal film is a tungsten film in one implementation.

The first conductive film or the second conductive film is a polysilicon film.

Another aspect of the present invention provides a method of forming gate electrode patterns of semiconductor devices, including the steps of forming a plurality of first gate electrode patterns in which a first conductive film, a dielectric film, a second conductive film, and a sacrificial film are laminated on a semiconductor substrate, wherein the first gate electrode patterns have a first distance and a second distance wider than the first distance; forming a first buried insulation film which is buried between the first gate electrode patterns having the first distance, and is deposited only on sidewalls between the first gate electrode patterns having the second distance; burying a second buried insulation film between the first gate electrode patterns in which a spacer is formed on sidewalls, the first gate electrode patterns having the second distance; removing the sacrificial film to form a trench surrounded by the first buried insulation film and the second conductive film; and forming a metal film within the trench to form a plurality of second gate electrode patterns in which the metal film is laminated on the second conductive film.

The sacrificial film is formed to define a region whereon the metal film will be formed as part of the first gate electrode patterns.

The method may further include the step of performing an ion implant process using the first gate electrode patterns as an ion implant mask to form a first ion implant region within the semiconductor substrate, after the first gate electrode patterns are formed.

The method may further include the step of performing an ion implant process using the first gate electrode patterns and the first buried insulation film as an ion implant mask to form a second ion implant region within the semiconductor substrate, after the first buried insulation film is formed. The first conductive film or the second conductive film may be a polysilicon film.

In one embodiment, a method for forming a semiconductor device includes forming a gate dielectric layer over a substrate; forming a first conductive layer over the gate dielectric layer; forming a sacrificial layer over the first conductive layer, patterning the gate dielectric layer, first conductive layer, and the sacrificial layers to form a plurality of gate electrode patterns; forming a buried insulation layer over and between the gate electrode patterns; removing the sacrificial layer to form a plurality of trenches surrounded by the buried insulation layer; and forming a metal layer within the trench to form a plurality of metal gate structures.

The method further comprising forming a dielectric layer including a nitrogen film and oxide film over the first conductive layer; and forming a second conductive layer over the dielectric layer, wherein the metal layer is formed on the second conductive layer, wherein the first conductive layer, dielectric layer, second conductive layer, and metal layer are used to define a plurality of gate electrodes. The buried insulation layer is configured to provide a good selectivity with respect to the sacrificial layer during the removal of the sacrificial layer.

In another embodiment, a method of forming a non volatile memory device includes forming a plurality of first gate electrode patterns having first and second polysilicon layers, a dielectric layer provided between the first and second polysilicon layers, and a sacrificial layer overlying the second polysilicon layer, the first gate electrode patterns defining at least one first trench having a first width. A plurality of second gate electrode patterns is formed having first and second polysilicon layers, a dielectric layer provided between the first and second polysilicon layers, and a sacrificial layer overlying the second polysilicon layer, the second gate electrode patterns defining at one second trench having a second width that is greater than the first width. A first insulation layer is formed over the first and second gate electrode patterns, the first insulation layer filing the first trench and being provided on sidewalls of the second trench. A second insulation layer is filled into the second trench. The sacrificial layer is removed to form a plurality of third trenches overlying the second polysilicon layer. A metal layer is formed within the third trenches to form a plurality of gate structures, the gate structures including the first and second polysilicon layers, the dielectric layer provided between the first and second polysilicon layers, and the metal layer formed over the second polysilicon layer.

The metal and second polysilicon layers define a silicide layer that is used to form a control gate of the non-volatile memory device, and the first polysilicon layer is used to form a floating gate of the non-volatile memory device. The dielectric layer is an ONO layer including an oxide layer, a nitride layer, and an oxide layer. The first gate electrode patterns are used to form a plurality of cell transistors, and the first insulation layer is formed to provide a gate spacer for a control transistor associated with the cell transistor. The control transistor is a source select transistor, and the metal layer comprises tungsten or titanium.

In another embodiment, a method of forming a NAND flash memory device includes forming a plurality of first gate electrode patterns having first and second polysilicon layers, a dielectric layer provided between the first and second polysilicon layers, and a sacrificial layer overlying the second polysilicon layer, the first gate electrode patterns defining at least one first trench having a first width; forming a plurality of second gate electrode patterns having first and second polysilicon layers, a dielectric layer provided between the first and second polysilicon layers, and a sacrificial layer overlying the second polysilicon layer, the second gate electrode patterns defining at least one second trench having a second width that is greater than the first width; forming a first insulation layer over the first and second gate electrode patterns, the first insulation layer filling the first trench and being provided on sidewalls of the second trench; filling a second insulation layer into the second trench; removing the sacrificial layer to form a plurality of third trenches overlying the second polysilicon layer; and forming a metal layer within the third trenches to form a plurality of gate structures, the gate structures including the first and second polysilicon layers, the dielectric layer provided between the first and second polysilicon layers, and the metal layer formed over the second polysilicon layer. The first gate electrode patterns are used to form a plurality of cell transistors used to store data, and the second gate electrode patterns are used to form a plurality of control transistor used to provide control signals to the cell transistors.

DETAILED DESCRIPTION OF THE INVENTION

Figure 1:
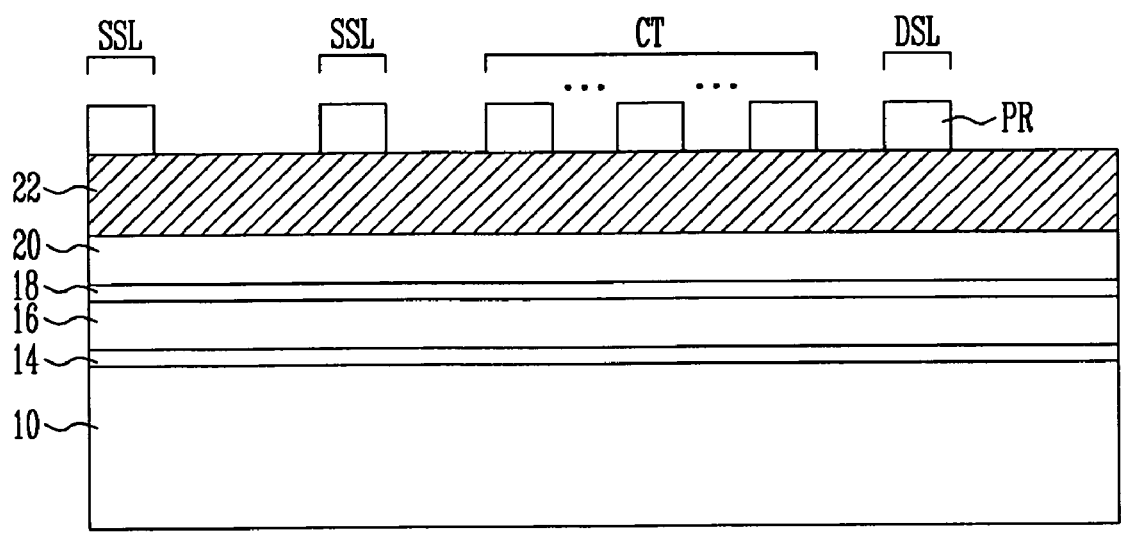
FIGS. 1-6 are sectional views illustrating a method of forming gate electrode patterns of semiconductor devices according to the present invention.

Now, specific embodiments according to the present invention will be described with reference to the accompanying drawings. Since preferred embodiments are provided so that one of ordinary skill in the art would be able to understand the present invention, they may be modified in various manners, and the scope of the present invention is not limited by the preferred embodiments described hereafter. When one film is described as being "on" another film or a semiconductor substrate, the first film may be directly brought into contact with the other film or the semiconductor substrate. A third film may be deposited between the first and second films or the semiconductor substrate. Furthermore, the figures exaggerate the thickness and size of each layer for convenience of explanation and clarity. Like reference numerals are used to identify the same or similar parts throughout the present invention.

FIGS. 1-6 are sectional views illustrating a method of forming gate electrode patterns of semiconductor devices according to the present invention.

Referring to FIG. 1, an insulation film 14 for a tunnel oxide film, a first polysilicon film 16 for a floating gate electrode, an ONO film 18, a second polysilicon film 20 for a control gate electrode, and a sacrificial nitride film 22 are sequentially formed on a semiconductor substrate 10 in which a cell region (the regions shown in FIGS. 1-6 are the cell region) and a peripheral region are defined.

The sacrificial nitride film 22 is subsequently removed. The sacrificial nitride film 22 is used to define the regions wherein tungsten film will be filled. That is, the sacrificial film 22 is used as part of a self-aligned tungsten gate electrode pattern formation process, where the removal of the sacrificial film defines the gate electrode patterns wherein the tungsten would be filled. Accordingly, since the tungsten film is formed in the region from which the sacrificial nitride film is removed, the silicon nitride film can be formed to a thickness of about 600-1500 Å.

The sacrificial nitride film 22 is used as a polish-stop layer in a subsequent process of polishing the buried insulation film 30 while being used as a hard mask of a gate electrode pattern in a subsequent etch process of forming the gate electrode pattern.

If the tungsten film is formed instead of the sacrificial nitride film 22, the tungsten film would be oxidized during the process of forming an oxide film for a spacer. The tungsten film, accordingly, is formed after the process of forming the oxide film for the spacer in the present embodiment.

Photoresist patterns PR for gate electrodes are then formed on the sacrificial nitride film 22. The photoresist patterns PR for the gate electrodes are formed in regions where cell transistors CT, gate electrode patterns SSL for a source select line SSL, and a gate electrode pattern DSL for a drain select line DSL will be defined.

Figure 2:
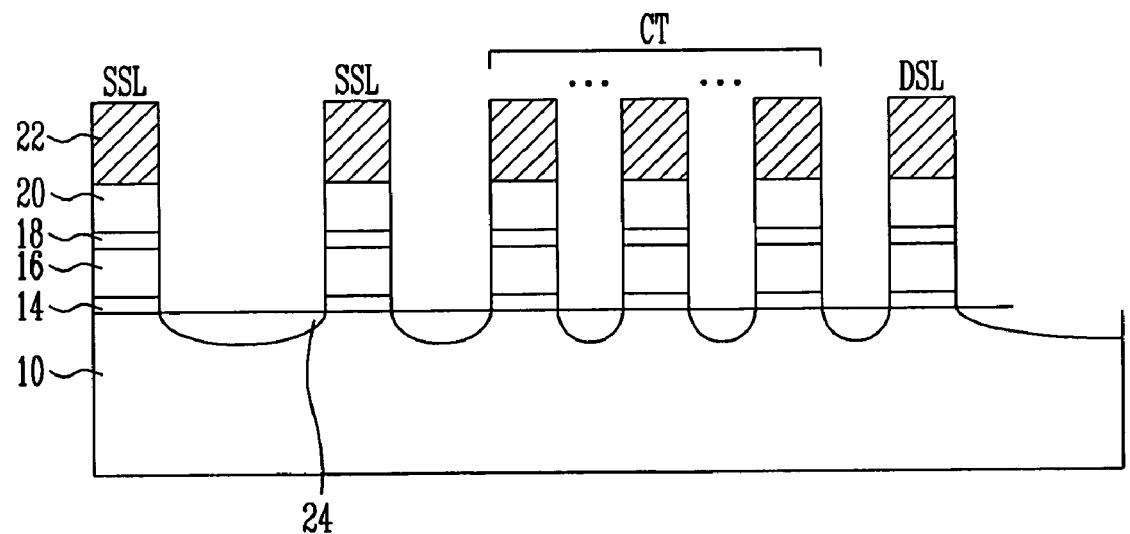

Referring to FIG. 2, the sacrificial nitride film 22 is etched and patterned using the photoresist patterns PR for the gate electrode as an etch mask.

The sacrificial nitride film 22 is used as a hard mask of the gate electrode pattern in an etch process of forming the gate electrode pattern.

An etching process of removing the photoresist patterns PR for the gate electrode is then performed. Thereafter, the second polysilicon film 20 for the control gate electrode, the ONO film 18, the first polysilicon film 16 for the floating gate electrode, and the insulation film 14 for the tunnel oxide film are etched-patterned using the patterned sacrificial nitride film 22 as an etch mask, forming first gate electrode patterns.

In the first gate electrode patterns, the cell transistors CT, the gate electrode patterns SSL for the source select line SSL and the gate electrode pattern DSL for the drain select line DSL are formed in the cell region. The gate electrode pattern (not shown) for a peripheral circuit is formed in the peripheral region (not shown).

Thereafter, an ion implant process is performed using the first gate electrode patterns CT, SSL and DSL as an ion implant mask, thus a forming first junction region 24 in predetermined regions within the semiconductor substrate 10.

Figure 3:
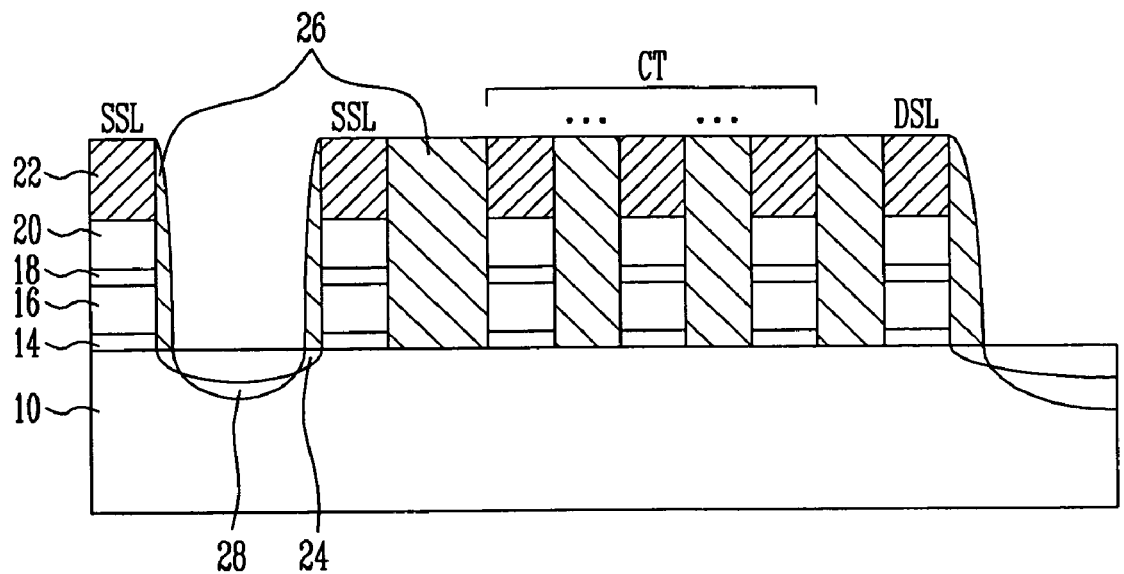

Referring to FIG. 3, the oxide film for the spacer is formed on the entire surface of the cell transistor CT, the gate electrode pattern SSL for the source select line SSL, and the gate electrode pattern DSL for the drain select line DSL. An etchback process is then performed on the oxide film for the spacer to form spacers 26.

The spacers 26 are formed using an oxide film. Since the sacrificial nitride film 22 is formed instead of the tungsten film on the second polysilicon film, the undesired oxidization of the tungsten film can be prevented. That is, if the tungsten film is formed instead of the sacrificial nitride film, tungsten film would be oxidized during the annealing process performed to form the spacer 26.

The spacers or oxide film 26 is filled into the space defined by the first gate electrode patterns in the dense region, i.e., in the cell region where cell transistors would be formed. Such a region is referred to herein as a dense region because the gate structures are densely formed. The spacers or oxide film 26 is formed on sidewalls of the first gate electrode patterns in an iso-region, wherein control transistors such as SSL or DSL are formed. Such a region is referred to herein as the iso-region since the gate structures are not densely formed when compared to the dense or cell region.

An ion implant process is then performed using the first gate electrode patterns and the spacer 26 as an ion implant mask, forming a second junction region 28 in a predetermined region within the semiconductor substrate 10 in which the first junction region 24 is formed.

Figure 4:
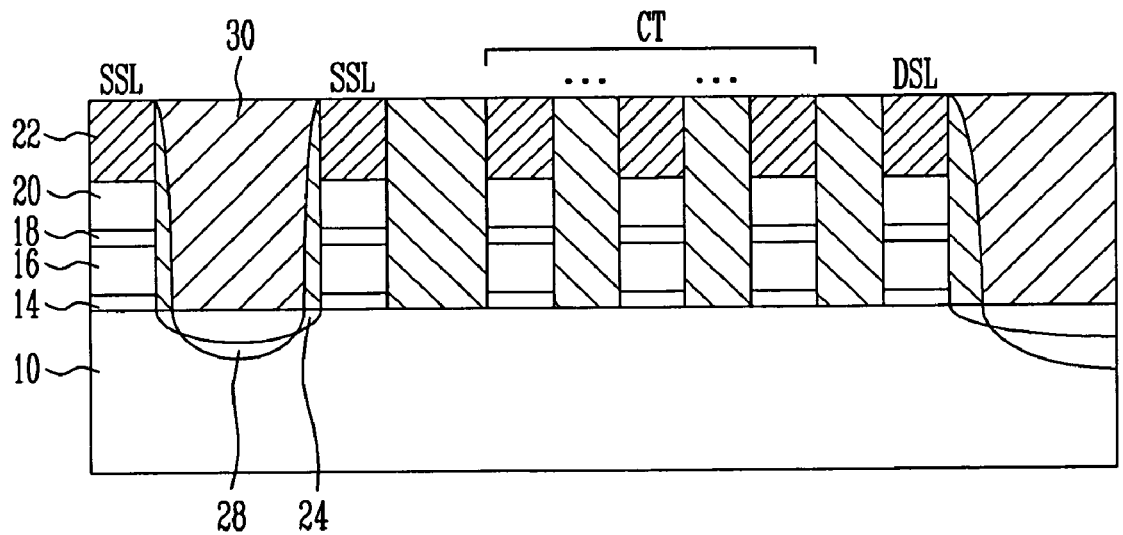

Referring to FIG. 4, the buried oxide film 30 is formed on the entire resulting surface. A polishing process such as chemical mechanical polishing (CMP) is then performed until the sacrificial nitride film 22 is exposed.

If the polishing process is carried out after the buried oxide film 30 is formed, the buried oxide film 30 is filled in the iso-region between the gate electrode pattern for a first source select line SSL and the gate electrode pattern for a second source select line SSL. The first SSL is associated with a first cell array, and the second SSL is associated with a second cell array.

The buried oxide film 30 is used since it has a good selectivity with respect to the nitride film, which is useful in a subsequent process of removing the sacrificial nitride film 22.

The sacrificial nitride film 22 is used as a polish-stop layer in a polishing process of the buried insulation film 30.

Figure 5:
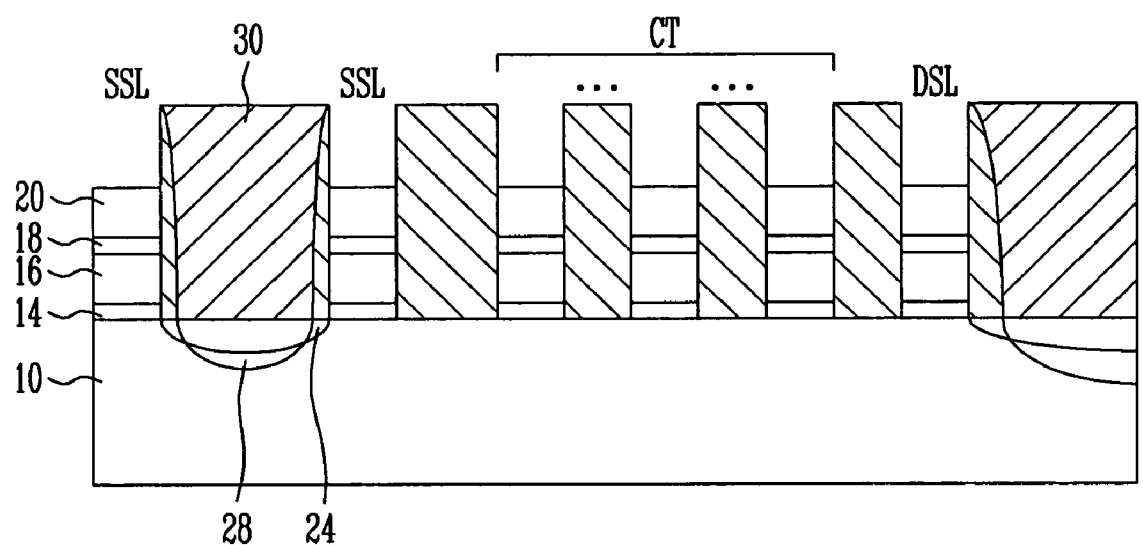

Referring to FIG. 5, a process of removing the sacrificial nitride film 22, exposed through the polishing process, is performed: The tungsten film is formed subsequently in the region that is defined by removing the sacrificial nitride film 22. The tungsten film is formed after the formation of the oxide spacers to prevent oxidation of tungsten, which would increase the gate resitivity.

The sacrificial nitride film is removed using a solution containing phosphoric acid ($H_3PO_4$). The phosphoric acid functions to selectively remove a neighboring buried oxide film when removing the sacrificial nitride film 22. A region where the tungsten film will be formed—i.e., the trench—is defined, and the tungsten film is then buried in the trench due to the buried oxide film 30, the spacer 26, and the patterned second polysilicon film. Thus, the gate electrode pattern of the tungsten film is formed using a a damascene process.

Figure 6:
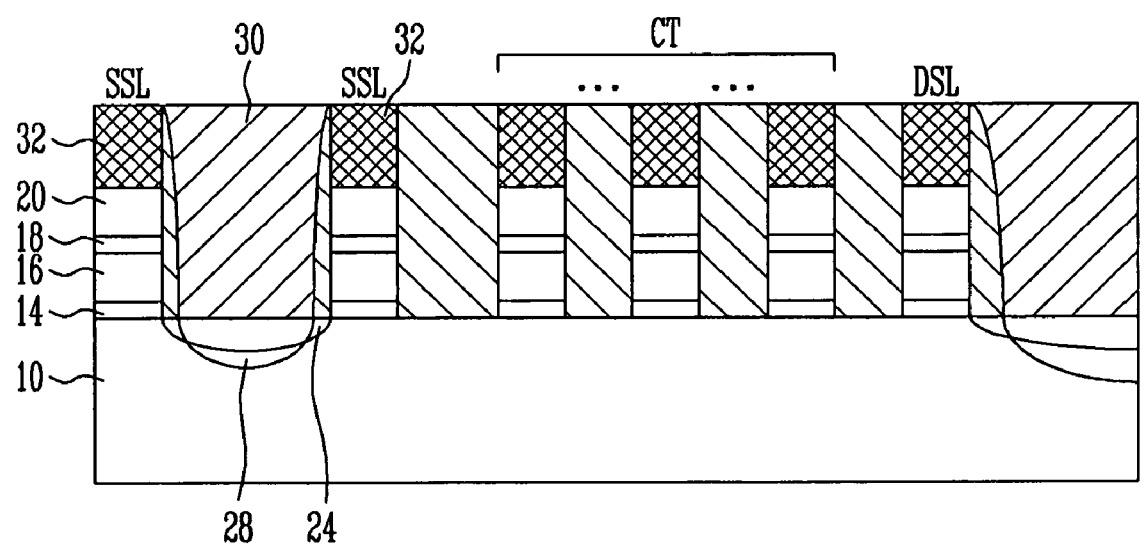

Referring to FIG. 6, the tungsten film is formed on the entire resulting surface including the region from which the sacrificial nitride film is removed. A polishing process such as CMP is then performed until the spacer 26 formed between the buried oxide film 30 and the cell transistors is exposed. Accordingly, the formation process of the second gate electrode pattern, in which a tungsten film 32 is laminated on the second polysilicon film, is completed.

The tungsten film 32 is formed to a thickness of about 300-600 Å.

The sacrificial nitride film 22, formed to a thickness of approximately 600-1500 Å, is etched to a predetermined thickness while subsequent processes are performed. Consequently, the tungsten film with about 300-600 Å in thickness remains in the region, which is defined by the removal of the sacrificial nitride film.

As described above, according to the present invention, a tungsten film is formed in a region, which is defined by the removal of a sacrificial nitride film and a formation process of a gate electrode pattern, in which the tungsten film is laminated on a second polysilicon film. Thus, tungsten abnormal oxidization, which is generated due to processes performed after the formation of the tungsten film, can be prevented. Accordingly, a profile of a gate electrode can be prevented from being damaged and device characteristics can be improved.

Although the foregoing description has been made with reference to the preferred embodiments, it is to be understood that changes and modifications of the present invention may be made by one of ordinary skill in the art without departing from the scope of the present invention and appended claims.

What is claimed is:

1. A method for forming a semiconductor device, the method comprising:
    forming a gate dielectric layer over a substrate;
    forming a first conductive layer over the substrate;
    forming a dielectric layer over the first conductive layer;
    forming a second conductive layer over the dielectric layer;
    forming a sacrificial layer over the second conductive layer;
    patterning the gate dielectric layer, the first conductive layer, the dielectric layer, the second conductive layer, and the sacrificial layer to form a plurality of gate electrode patterns;
    forming a buried oxide layer over and between the gate electrode patterns;
    removing the sacrificial layer to form a plurality of trenches surrounded by the buried oxide layer, wherein the second conductive layer is exposed by the removal of the sacrificial layer;
    forming a metal layer over the semiconductor substrate to form a plurality of metal gate structures, wherein the metal layer fills the trenches, the metal layer contacting the second conductive layer exposed by the removal of the sacrificial layer; and
    performing a polishing process to remove the metal layer formed on the buried oxide layer, wherein the metal layer remains within the trenches,
    wherein the metal layer is formed after the buried oxide layer has been formed to minimize oxidation of the metal layer.

2. The method as claimed in claim 1, wherein the dielectric layer including a nitride film and an oxide film, and
    wherein the first conductive layer, the dielectric layer, the second conductive layer, and the metal layer together define a plurality of gate electrodes.

3. The method as claimed in claim 1, wherein the sacrificial layer includes primarily of nitride.

4. The method as claimed in claim 1, wherein the sacrificial layer is removed using a solution containing phosphoric acid ($H_3PO_4$).

5. The method as claimed in claim 1, wherein the buried oxide layer is configured to provide a good selectivity with respect to the sacrificial layer during the removal of the sacrificial layer.

6. The method as claimed in claim 1, wherein the first conductive layer, the dielectric layer, the second conductive layer, and the metal layer together define a plurality of gate electrodes, the method further comprising:

performing an etch-back on the buried oxide layer to form oxide spacers at least on sidewalls of selected gate electrodes.

7. The method as claimed in claim 1, wherein the buried oxide layer is formed prior to the metal layer to prevent oxidation of the metal layer, and wherein the dielectric layer includes a nitride film and an oxide film.

8. The method as claimed in claim 1, wherein the metal layer includes tungsten.

9. The method as claimed in claim 1, wherein the first conductive film and the second conductive film comprise polysilicon.

* * * * *